United States Patent [19]
Bhattacharyya et al.

[11] Patent Number: 4,776,922
[45] Date of Patent: Oct. 11, 1988

[54] FORMATION OF VARIABLE-WIDTH SIDEWALL STRUCTURES

[75] Inventors: Arup Bhattacharyya, Essex Junction; Michael L. Kerbaugh, Burlington; Robert M. Quinn, South Burlington; Jeffrey A. Robinson, Essex Junction, all of Vt.

[73] Assignee: International Business Machines Corporation, Armonk, N.Y.

[21] Appl. No.: 114,959

[22] Filed: Oct. 30, 1987

[51] Int. Cl.$^4$ .................... B44C 1/22; C03C 15/00; C23F 1/02; B29C 37/00
[52] U.S. Cl. .................... 156/643; 156/646; 156/648; 156/653; 156/656; 156/657; 156/659.1; 156/668; 204/192.37; 437/228; 437/235; 437/245
[58] Field of Search ............... 156/643, 646, 648, 652, 156/653, 656, 657, 659.1, 668; 430/313, 314, 317, 318; 204/192.32, 192.35, 192.36, 192.37; 437/40, 41, 56–59, 61, 63, 80, 203, 228, 235, 245

[56] References Cited

U.S. PATENT DOCUMENTS

| 4,424,621 | 1/1984 | Abbas et al. | 156/657 X |
| 4,502,914 | 3/1985 | Trumpp et al. | 156/655 X |
| 4,577,391 | 3/1986 | Hsia et al. | 437/56 X |
| 4,648,937 | 3/1987 | Ogura et al. | 156/643 |

Primary Examiner—William A. Powell
Attorney, Agent, or Firm—Mark F. Chadurjian

[57] ABSTRACT

Spacers are formed having widths that vary as a function of the spacing between the mandrels upon which the conformal material that defines the spacers is deposited and etched. As the spacing between adjacent mandrels decreases, the width of the resulting spacers decreases. The correlation between mandrel spacing and sidewall structure width is independent of the thickness of the conformal material as-deposited. As the spacing between the mandrels decreases, the decrease in width becomes more pronounced, particularly at mandrel spacings of five microns or less. Thus, by making adjacent mandrels closer together or further apart and adjusting mandrel height, active/passive components having differing widths/lengths may be formed from the same conformal layer.

6 Claims, 5 Drawing Sheets

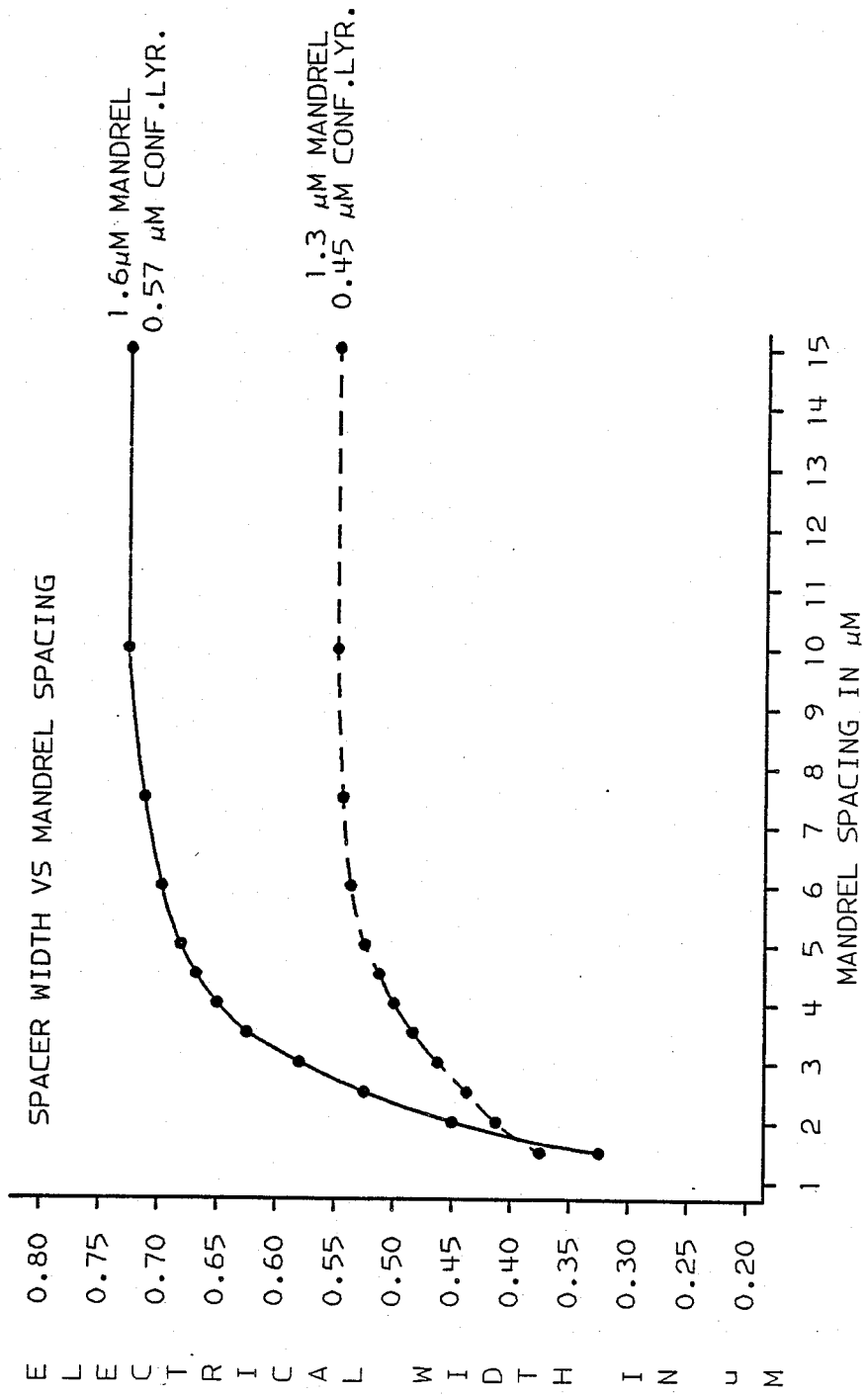

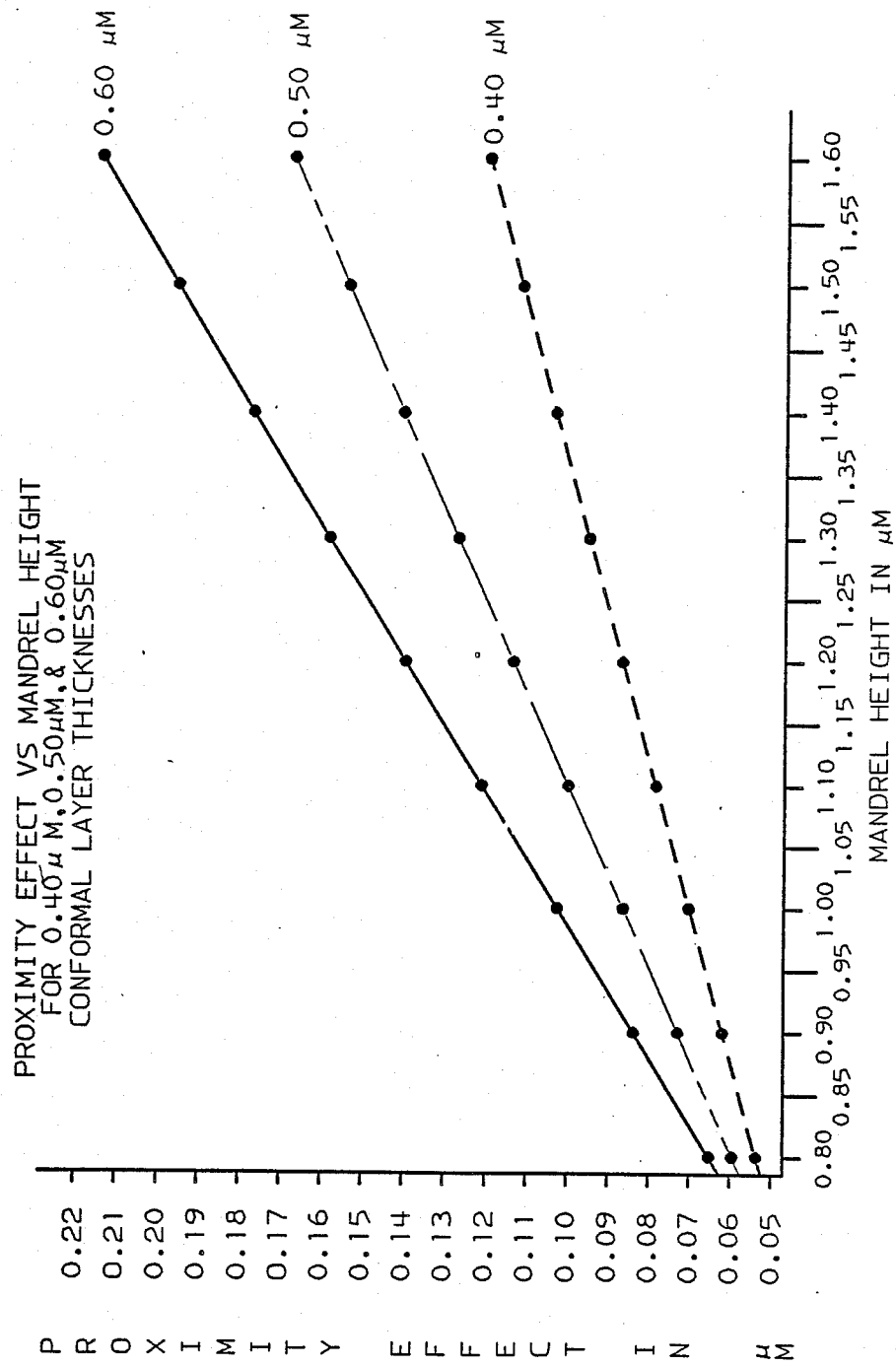

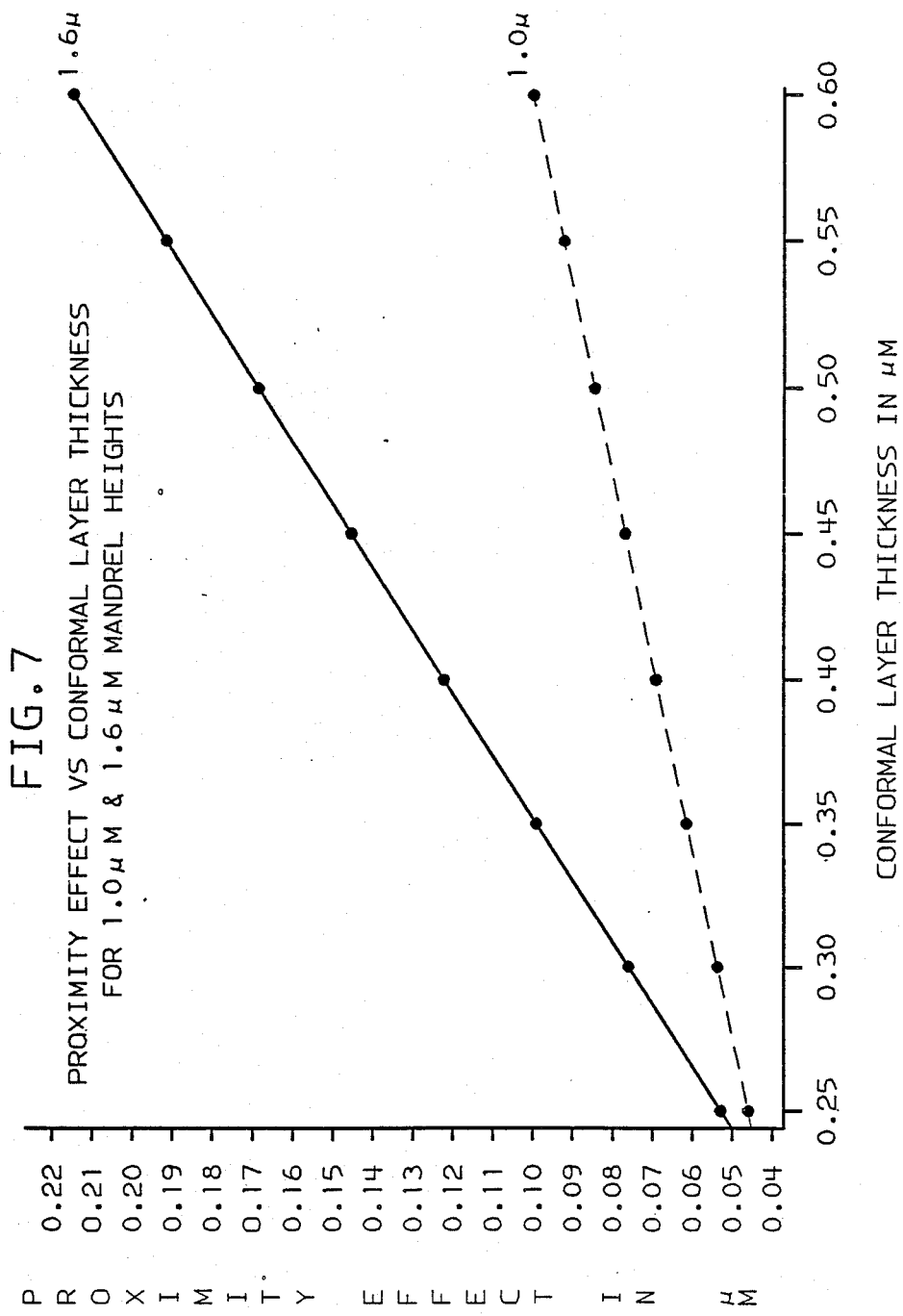

FORMATION OF VARIABLE-WIDTH SIDEWALL STRUCTURES

CROSS-REFERENCE TO RELATED APPLICATIONS

Reference is made to U.S. patent application Ser. No. 924,233, entitled "Lithographic Image Size Reduction," filed Oct. 28, 1986, by Beyer, now U.S. Pat. No. 4,707,218 and assigned to the assignee of the invention. The application relates to the general idea of using inorganic conformal layers to define sidewall spacers on vertically-imaged photoresist. The spacers define images having an area less than the images normally printed by the photolithographic exposure system.

BACKGROUND ART

Over the past several years, many different methods of forming sub-micron images have been proposed in the integrated circuit processing art. Many of these methods rely on state-of-the-art photolithographic tooling. Other methods rely on more exotic exposure systems (e.g., X-ray, E-beam, etc.). Whichever of the above exposure systems are used, its source intensity, beam focus, and other properties combine to establish a minimum feature size that can be reliably printed.

One method of supplementing this minimum image is by the use of sidewall structures.

In "sidewall spacer" or "spacer" technology, a conformal layer is coated on a "mandrel," which is a block of material typically having substantially vertical sidewalls. The conformal layer is then etched in an anisotropic mode, so that portions thereof overlaying horizontal surfaces (e.g., the upper surface of the mandrel) are removed, while portions thereof overlaying vertical surfaces (i.e., the sidewalls of the mandrels remain to form the spacers. The substrate is then treated in an etchant that selectively attacks the mandrels without substantially attacking the spacers.

An example of forming sub-micron images by utilizing sidewall technology is shown in U.S. Pat. No. 4,358,340, entitled "Submicron Patterning Without Using Submicron Lithographic Technique," issued Nov. 9, 1982, to Fu and assigned to Texas Instruments. A layer of polysilicon is deposited on an oxide mandrel and is etched to define polysilicon spacers. The mandrel is then removed without removing the polysilicon spacers. The patent teaches that since the width of the sidewall structures is a function of the thickness of the layer as-deposited (rather than the image size of the exposure system), polysilicon gate electrodes may be formed having widths on the order of ½ micron.

Attendant with the drive towards forming smaller structures is the need to simultaneously provide larger structures. For example, a chip that requires ½ micron gate widths for the transfer FET devices in a dynamic random access memory array may also require one micron gate widths for the FETs in the support circuitry that sink large currents or drive large loads. If one has the luxury of utilizing a ½ micron exposure system, it would be a simple matter to print one micron images. However, if one were utilizing the above-described spacer technology, one would need a method for controllably varying the width of the sidewall structures so that both ½ micron and one micron spacers could be produced on the same wafer from the same conformal layer deposit.

Several workers have explored the relationship between the characteristics of the conformal layer as-deposited and the characteristics of the resulting spacers. See e.g. an article by Dhong et al, entitled "Sidewall Spacer Technology For MOS and Bipolar Devices," *J. Electrochem. Soc.,* Vol. 133, No. 2, Feb. 1986, pp. 389–396. Dhong found that the spacer width increases as the angle of the mandrel sidewalls increases toward 90°, and that as the thickness of the conformal layer as-deposited increases, both the slope and height of the resulting spacers decrease.

The above studies established that the resulting spacers are sensitive to processing variations. This led the inventors to consider controllably varying the process to produce controllable variations in the widths of the spacers. However, neither of the above-noted processing sensitivities would provide good results. That is, it would be extremely difficult to controllably vary either the mandrel height or the thickness of the conformal material across a given wafer without using additional masking/etching steps.

Thus, a need exists in the art for a method of controllably varying the widths of the spacers formed on a workpiece without introducing extra process complexity.

SUMMARY OF THE INVENTION

It is thus an object of the present invention to provide a process for controllably varying the widths of spacers formed on a workpiece.

It is another object of the invention to provide a process that varies spacer widths without introducing additional process steps.

The above and other objects of the invention are realized by varying the spacing between the mandrels upon which the conformal material is deposited and etched. As the spacing between adjacent mandrels decreases, the width of the resulting sidewall structures decreases. The amount of this decrease can be controlled by adjusting the mandrel height and the thickness of the conformal material as-deposited. As the spacing between the mandrels decreases below three microns, the decrease in width becomes more pronounced. Thus, by making adjacent mandrels closer together or further apart, structures having differing widths may be formed from the same conformal layer.

BRIEF DESCRIPTION OF THE DRAWING

The above and other structures and teachings of the invention will become more apparent upon a review of the detailed description thereof as rendered below. In the description to follow, reference will be made to the accompanying Drawing, in which:

FIG. 5 is a graph showing the variation in spacer width as a function of mandrel spacing for two different mandrel heights/conformal layer thicknesses;

FIG. 6 is a graph showing the variation in the proximity effect as a function of mandrel height, for three different conformal layer thicknesses; and FIG. 7 is a graph showing the variation in the proximity effect as a function of conformal layer thickness, for two different mandrel heights.

DETAILED DESCRIPTION OF THE BEST MODE FOR CARRYING OUT THE INVENTION

Figure 1:
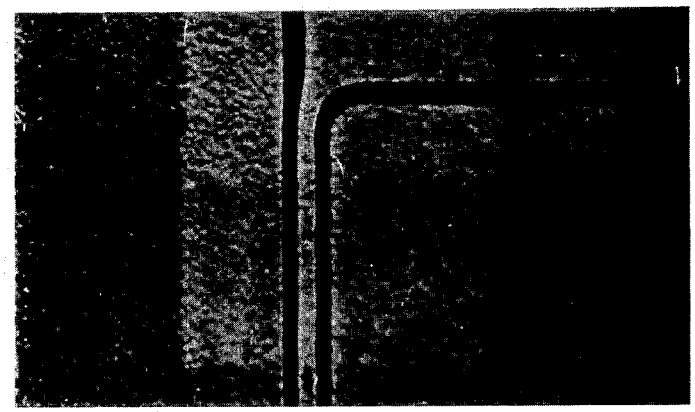
FIG. 1 is a top view SEM of a test wafer showing the proximity effect.

It has been observed that when the spacing between mandrels decreases, the width of the resulting spacers decreases. This is shown by the scanning electron microscope (SEM) photograph in FIG. 1. The dark lines are the spacers. The grey spaces to the left of the spacer on the left, and inside the box defined by the spacer on the right, are portions of the substrate that were previously covered by mandrel structures. Note that the portions of the sidewall structures that diverge from one another are much thicker than the portions that are in close proximity to one another.

Figure 2:
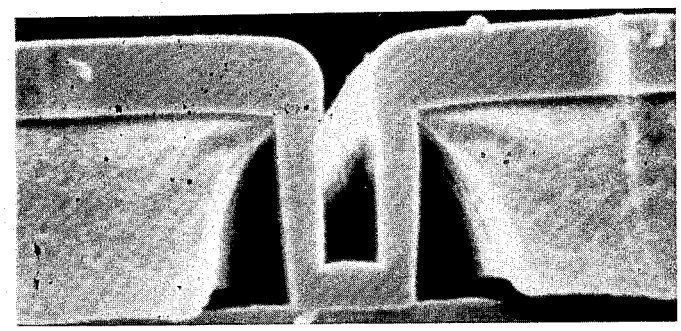
FIG. 2 is a cross-sectional SEM of a test wafer having a mandrel spacing of one microns.
Figure 3:
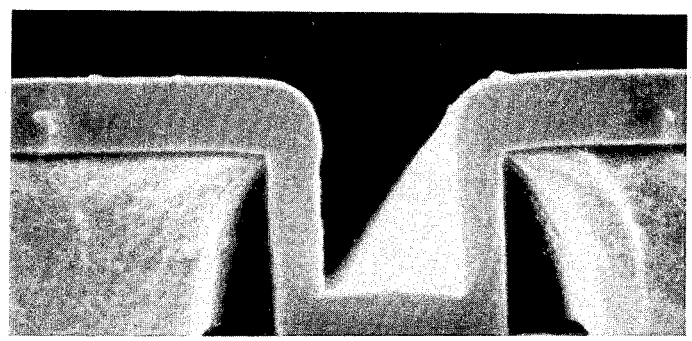
FIG. 3 is a cross-sectional SEM of a test wafer having a mandrel spacing of two microns.
Figure 4:
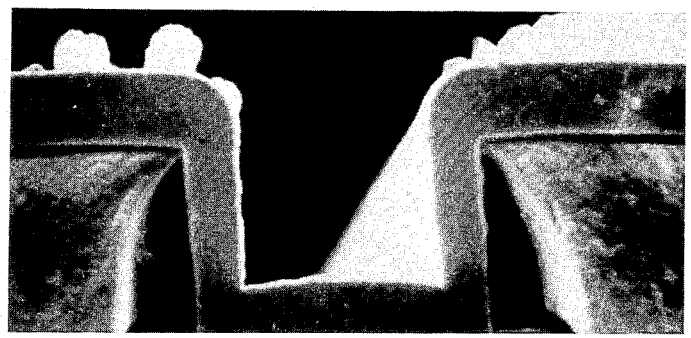
FIG. 4 is a cross-sectional SEM of a test wafer having a mandrel spacing of three microns.

This "proximity effect" is shown in cross-section in FIGS. 2-4 by the SEM's shown. In these Figures, plasma enhanced chemical vapor deposited (PECVD) silicon nitride was conformally deposited on polyimide mandrels of approximately 1.6 microns in height. While the SEM's appear to show mandrels having an "undercut" or overhang profile, in practice the mandrels had vertical sidewalls. In taking a cross section of the wafer, the polyimide material adjacent to the nitride was pulled away due to sample preparation techniques. The silicon nitride deposition was carried out for a time sufficient to form a layer of 0.65 microns on a flat surface. The spacing between mandrels is approximately one micron in FIG. 2, two microns in FIG. 3, and three microns in FIG. 4. Note that the amount of silicon nitride deposited on the sidewalls of the mandrels is much less in FIG. 2 as it is in FIG. 3; note also that the difference in sidewall deposition thickness is much less between FIGS. 3 and 4 as compared to FIGS. 2 and 3.

The proximity effect appears to be caused by the mechanisms of vapor deposition. Source materials are supplied to the reaction chamber in gaseous form. The amount of material deposited is a function of the amount of source gas available. As the spacing between mandrels decreases, the amount of source gas decreases (or is depleted) relative to the surfaces to be covered. Thus, since less source gas is available, a smaller amount of material is deposited.

Subsequent studies confirmed the proposed proximity effect mechanism. Test sites were prepared in accordance with the method described in U.S. Pat. No. 4,648,937 (issued 3/10/87 to Ogura et al and assigned to the assignee of the present invention), the teachings of which are completely incorporated herein by reference. That is, the resulting silicon nitride spacers were used as masks to pattern an underlaying polysilicon layer. The resistivity of the resulting polysilicon lines indicates the width of spacers as formed.

FIG. 5 is a graph of spacer width versus mandrel spacing for mandrels having a height of 1.3 microns (lower curve) and 1.6 microns (upper curve), and for a conformal layer of 0.45 microns in thickness (lower curve) and 0.57 microns in thickness (upper curve). First of all, note that the width of the spacers at the maximum mandrel spacings of 15 microns is shown on the graph as 0.72 microns (upper curve) and 0.55 microns (lower curve). As discussed in the Dhong et al article, the width of the spacer bottom will be greater than the thickness of the conformal material as-deposited. This effect is enhanced as the thickness of the conformal material as-deposited increases and/or as the mandrel height increases. Since the resulting spacers are used as a mask to anisotropically etch the underlaying polysilicon layer, the width of the spacer bottoms will determine the width of the resulting polysilicon lines. The curves show that spacer width decreases as mandrel spacing decreases. The decrease appears to become significant (i.e., on the order of 0.2 microns or more) at mandrel spacings below approximately five microns. Moreover, note that the total effect (in terms of the spacer width difference between points at either end of the curve) is approximately 0.15 microns for the lower curve and 0.40 microns for the upper curve. In other words, the proximity effect is enhanced by increasing the mandrel height and/or the conformal layer thickness. In particular, note the 0.12 difference in the upper curve at a mandrel spacing of 2.0 microns versus 1.5 microns.

FIG. 6 is a graph showing the proximity effect versus mandrel height for different conformal layer thicknesses. The proximity effect value is given by the difference between the spacer width at a mandrel spacing of 15 microns and a mandrel spacing of 2.5 microns. Thus, for example, for a mandrel height of 1.00 microns and a conformal layer thickness of 0.50 microns, the difference between the spacer widths at 15 micron versus 2.5 micron mandrel spacings is approximately 0.085 microns. FIG. 6 shows that increased mandrel height will increase the proximity effect. For the 0.4 micron thick conformal layer, the effect increases from 0.065 $\mu m$ to 0.105 as the mandrel height is raised from 1.0 microns to 1.5 microns. This enhancement of the proximity effect is greater as the thickness of the conformal layer is increased. FIG. 7 is a graph showing the change in proximity effect versus conformal material thickness, as a function of different mandrel heights. Again, note that the 1.5$\mu$ mandrels produce a greater proximity effect for a given nitride thickness. In general, the curves of FIGS. 6 and 7 confirm that the proximity effect increases with increasing mandrel height and increasing conformal layer thickness. Moreover, because the slopes of the curves shown in FIGS. 6 and 7 are relatively similar, mandrel height and conformal layer thickness are equivalent factors in determining the change in spacer width. However, since neither of these parameters can be varied across a given wafer without adding process steps, in the present invention it is preferred to use them to enhance the proximity effect by providing a greater swing in spacer widths (as shown e.g., in the upper curve versus the lower curve in FIG. 5). More particularly, since the invention is intended to be used to provide minimum spacer widths (e.g., such that 0.1-1.0 micron conformal layers would be used), it is preferred to enhance the proximity effect by simply raising the mandrel heights above 1.5 microns. It should be noted that while the proximity effect shown in FIG. 6 and 7 is referenced from a mandrel spacing of 2.5 micron, the observed effect would be significantly enhanced when referenced from a mandrel spacing of 1.5 microns (as demonstrated in FIG. 5).

Thus, by controlling the spacing between mandrels formed on a wafer, spacers having varying, well-defined linewidths can be formed from the same conformal layer deposition. This technique can be used to form FET gate electrodes (and other active and passive components) having varying lengths/widths on the same wafer. While the invention has been practiced by the use of CVD silicon nitride, the source depletion mechanism will be present for any conformal material that is vapor deposited. Thus, the invention can be used to form insulative (e.g., silicon oxide, silicon nitride, silicon oxynitride, etc.) or conductive e.g. a, CVD metal such as tungsten, molybdenum, hafnium, etc.) spacers on organic mandrels (e.g., photosensitive polymers, polyimide, etc.) or inorganic mandrels (e.g. silicon oxide, silicon nitride, alumina, etc.).

It is to be understood that while the invention has been shown and described with reference to a particular embodiment, the scope of the invention is not to be limited thereby. That is, modifications may be made to the embodiments shown without departing from the ambit of the invention as reflected by the several claims.

What is claimed is:

1. A method of forming spacers having respective widths that vary from one another on a substrate, comprising the steps of forming mandrels on the substrate at respective varying distances from one another, at least some of said respective varying distances being less than approximately five microns, depositing a conformal layer on said mandrels, and anisotropically etching said conformal layer to provide said spacers.

2. The method as recited in claim 1, wherein said mandrels comprise an organic resin selected from the group consisting of photosensitive polymers and polyimides.

3. The method as recited in claim 1, wherein said conformal layer comprises a CVD metal.

4. The method as recited in claim 1, wherein said conformal layer comprises a insulative material selected from the group consisting of silicon oxide, silicon nitride, silicon oxynitride, and alumina.

5. A method of forming a first set of spacers having first widths and a second set of spacers having second widths greater than said first widths on a substrate, comprising the steps of:
   forming a plurality of mandrels having substantially vertical sidewalls and a height greater than approximately one micron on the substrate, a first set of said mandrels being spaced from one another by a distance less than approximately two microns and a second set of said mandrels being spaced from one another by a distance greater than approximately five microns;
   depositing a conformal layer on the substrate and said mandrels; and
   anisotropically etching said conformal layer to remove portions of said conformal layer other than portions thereof disposed on said sidewalls of said mandrels, the first set of spacers being formed on said sidewalls of said mandrels in said first set of mandrels and the second set of spacers being formed on said sidewalls of said mandrels in said second set of mandrels.

6. The method as recited in claim 5, wherein said conformal layer has a thickness of 0.1 to 1.0 microns as-deposited.

* * * * *